(12) United States Patent
Pekkarinen et al.

(10) Patent No.: US 6,593,808 B2
(45) Date of Patent: Jul. 15, 2003

(54) SET-UP METHOD FOR A LINEARIZING CIRCUIT

(75) Inventors: Jari Pekkarinen, Fleet (GB); Toni Neffling, Espoo (FI)

(73) Assignee: Nokia Corporation, Espoo (FI)

( * ) Notice: Subject to any disclaimer, the term of this patent is extended or adjusted under 35 U.S.C. 154(b) by 245 days.

(21) Appl. No.: 09/767,290

(22) Filed: Jan. 19, 2001

(65) Prior Publication Data

US 2002/0127979 A1 Sep. 12, 2002

Related U.S. Application Data

(63) Continuation of application No. PCT/EP98/04989, filed on Jul. 27, 1998.

(51) Int. Cl.[7] .............................................. H03F 3/66
(52) U.S. Cl. .............................. 330/52; 330/151; 330/2
(58) Field of Search ........................ 330/52, 144, 151, 330/2

(56) References Cited

U.S. PATENT DOCUMENTS

| | | | |
|---|---|---|---|
| 4,694,258 A | | 9/1987 | Blumenkranz et al. ........ 330/2 |
| 5,313,657 A | * | 5/1994 | Sakamoto et al. .......... 330/2 X |
| 5,515,000 A | * | 5/1996 | Maruyama et al. ........... 330/52 |
| 5,528,196 A | | 6/1996 | Baskin et al. ............... 330/151 |
| 6,163,210 A | * | 12/2000 | Fukuchi ...................... 330/52 |

FOREIGN PATENT DOCUMENTS

EP   0685 931 A1   12/1995

OTHER PUBLICATIONS

International Search Report for PCT/EP98/04989.

* cited by examiner

*Primary Examiner*—Steven J. Mottola
(74) *Attorney, Agent, or Firm*—Squire, Sanders & Dempsey L.L.P.

(57) ABSTRACT

A method of setting up a linearizing circuit such as a linear power amplifier is described. According to the method, an input signal is supplied at a low, starting power level and is lowly increased during a set-up until it attains an operational level for normal use. The advantage of this is that pilot tone used in the linearizing circuit can be readily detected during set-up because its amplitude is above that of the low, starting power level of the input signal. A feed-forward linearizing system and a transmission system utilizing the technique are described.

9 Claims, 6 Drawing Sheets f = FREQUENCY
a = AMPLITUDE f = FREQUENCY
a = AMPLITUDE

SET-UP METHOD FOR A LINEARIZING CIRCUIT

This application is a continuation of international application No. PCT/EP98/04989, filed Jul. 27, 1998.

The present invention relates to a set-up method for a linearising circuit and particularly but not exclusively to a so-called feed-forward linearising system.

The present invention is concerned with linearised circuits and particularly but not exclusively with linearised power amplifiers, that is amplifiers which do not generate distortion products and thus produce output signals containing only the spectral components of the input signal. Outside the input signal spectrum, signals are attenuated as far as possible. Such amplifiers are used particularly in mobile communications networks, where transmission systems operate within designated frequency bands which are termed herein transmission bands or communication bands. For example, according to one mobile communications standard, transmission channels each having a band width of 5 MHz may lie within a communication band of 2.11 GHz to 2.17 GHz, that is having an overall frequency width of 60 MHz. Thus, the power amplifier which amplifies these transmission channels prior to transmission via an RF antenna is effective if it amplifies signals in this frequency range, but attenuates signals outside that frequency range to avoid, as far as possible, interfering signals being transmitted.

Linear power amplifiers are subject to the generation of interference or distortion products which, if supplied with the output signal, cause unwanted interference. In an attempt to reduce this interference as far as possible, a feed-forward system is used when the amplifier is operating. According to this feed-forward system, a pilot tone is supplied to the amplifier in addition to the input signal which is to be amplified. At the output of the amplifier, a coupler takes a sample of the output signal. A pilot signal detection circuit detects the pilot tone, which has now been subject to the interference products, and supplies this to an adaptive control unit which compares the extracted pilot tone with the input pilot tone to generate a correction signal for the power amplifier. The purpose of the correction signal is to adjust the feed-forward system of the amplifier so that the original distortion or interference products generated within the amplifier are substantially cancelled.

It can be seen that such a linearisation method relies on the pilot signals being easily detectable at all times. If this is not the case, problems arise when trying to extract the modified pilot signal from the output signal. The comparison between the output pilot signal and the input pilot signal is then flawed which results in the feed-forward system of the amplifier being compromised and will not effectively linearise the amplifier. It will be understood that the accuracy and speed of the linearisation are closely associated with the ability to detect the pilot signal and thus the ratio of the amplitudes of the pilot signal and the interference signal is highly important to the optimal operation of the amplifier.

The problem of detection of the pilot signal is greatest when the amplifier is initially switched on. At this time, the spectrum of the output signal is highly broadened since the adaptive control unit takes some time to adjust the feed-forward system to optimise the amplitude and phase controls to linearise the amplifier. Consequently, when the amplifier is initially switched on, the amplified output signal contains high levels of interference which reduces the ratio of pilot signal amplitude to interference signal amplitude to the point where it becomes difficult to accurately detect the pilot signal. Since the pilot signals are naturally limited to lower power levels than those of the amplified signals, in some instances the amplitude of the interference may be greater than the amplitude of the pilot signal, further hindering pilot signal detection.

It is thus desirable to establish an initialisation procedure for a linear amplifier which ensures that the pilot signals are easily detectable at all times, even during the initial start-up of the amplifier.

According to one aspect of the present invention there is provided a method of setting up a linearising circuit in which a pilot tone is used both during set-up and during normal operation for interference cancellation, wherein the set-up method comprises:

supplying an input signal to the linearising circuit at a low, starting power level;

detecting the pilot tone in an output signal of the linearising circuit;

comparing the detected pilot tone with the supplied pilot tone to determine the interference products of the linearising circuit, and using said interference products to generate a correction signal for interference cancellation at the linearising circuit;

increasing the power level of the input signal to the linearising circuit during set-up while continuing to detect the pilot tone for interference cancellation until the power level of the input signal attains an operational level for normal use.

The correction signal can be applied with an adaptation factor which determines the speed of the correction process. The present invention allows for this adaptation factor to be set to a high value during start-up while the power level of the input signal is at the low level. The adaptation factor can then be reduced to its normal operational level for normal use.

Another aspect of the present invention provides a feed forward linearising system comprising:

a linearising circuit arranged to receive an input signal and a pilot tone for interference cancellation purposes;

detection means for detecting the pilot tone in an output signal of the linearising circuit and for comparing it with the supplied pilot tone to determine a correction signal;

adaptation means for applying the correction signal to the linearising circuit for interference cancellation purposes; and attenuation means for setting the power level of the input signal to a low, starting level for set-up purposes, and for increasing the power level of the input signal during set-up to an operational level for normal use.

In the described embodiment the linearising circuit is a linearised power amplifier.

The invention is particularly useful when utilised within a transmission system for a mobile communications network. Thus, the invention also provides a transmission system for a mobile communications network comprising:

means for generating an information signal representing data to be transmitted via the mobile communications network;

a mixer for combining said information signal with a carrier signal to generate a combined signal for transmission purposes;

a power amplifier for amplifying said combined signal to a power level adequate for transmission via an RF antenna; and a start-up unit for said linear power amplifier which attenuates the combined signal prior to supplying it to the power amplifier for the purposes of setting up the power amplifier prior to its normal use.

According to the embodiment described herein, an initialisation method for a feed-forward power amplifier is disclosed in which pilot tones are used for amplitude and phase control. The described method comprises the steps of:

setting the power level of the signal to be amplified at a low level when the amplifier is switched on, setting to a high value an adaptation factor which determines the speed of the adaptation process, increasing the power level of the signal to be amplified step by step in order to approach the required power level (for normal operation), reducing the adaptation factor during the process to make the adaptation less susceptible to interference during normal use, and switching off the start-up procedure to an idle state after the amplifier has settled into stable operation and the required power level of the input signal has been reached.

Although described in the context of a linearised power amplifier, the invention can be used in any lineariser if a pilot tone is used for distortion corrections. The technique described herein allows for effective and quick distortion cancellation in a feed-forward lineariser. This is achieved by starting adjustments of the feed-forward loop and adaptation process at a low input power and gradually increasing the power when proper cancellation is reached.

For a better understanding of the present invention and to show how the same may be carried into effect, reference will now be made by way of example to the accompanying drawings in which:

FIG. 1 illustrates a transmission system 1 for an RF communications network such as that for a mobile telephone network. Such a transmission system may be utilised for example, at a base-station for the communications network or within mobile stations communicating with the base station.

Figure 1:
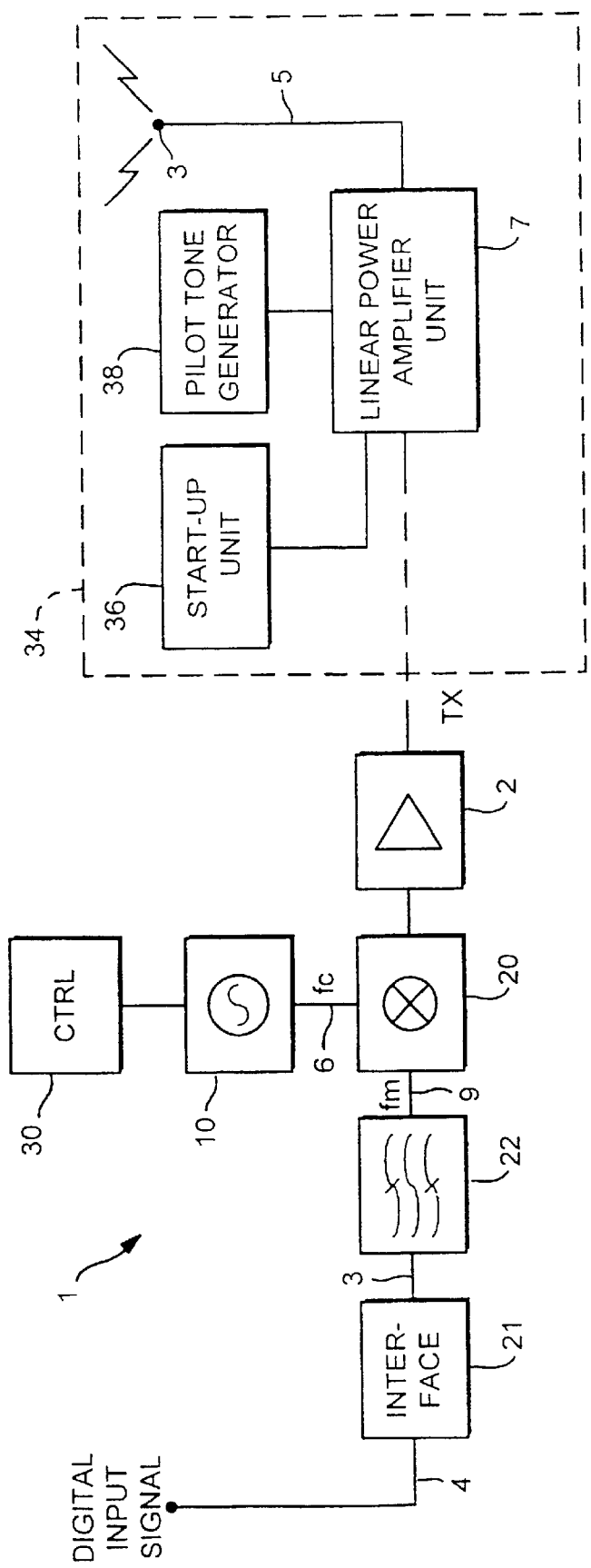
FIG. 1 illustrates a transmission system for a mobile communications network.

An input signal 4, in digital format, is supplied to the system from a data generator (not shown). The input signal may contain voice information or any other such information which is required to be transmitted. The input signal is fed into an interface unit 21 which performs the necessary encoding etc. to generate an information signal for transmission. The precise details depend on the nature of the communication system. As an example in a WBCDMA system, a spreading code is used to generate a modulation signal 3 of bandwidth around 5 MHz.

The information signal 3 is passed through a bandpass filter 22. The filtered signal at a modulation frequency fm is supplied to a mixer 20.

A local oscillator 10 generates a carrier signal 6 at a carrier frequency which is fed into the mixer 20. The carrier frequency fc is selectable by a controller 30 within a transmission band which in this example lies between 2.11 GHz ($f_2$) and 2.17 GHz ($f_3$). The information signal and the carrier signal are mixed and output as a transmission signal TX. The transmission signal thus comprises the carrier signal 6 modulated by the information signal 9.

A preamplifier 2 amplifies the transmission signal TX to a level which will enable the signal to be transmitted via land line to an antenna 3, which may be situated distant from the base station, without the signal becoming attenuated to such an extent that it becomes undetectable. The antenna 3 is located at an antenna station 34. At the antenna station, the transmission signal is fed into a linear power amplifier unit (LPA) 7 and is again amplified to levels which permit it to be transmitted as electromagnetic radiation at an RF frequency over large distances. The linear power amplifier unit itself comprises several components as will be described later. It is associated with a start-up unit 36 and a pilot tone generator 38.

Once amplified to the required power levels by the linear power amplifier unit 7, the transmission signal is fed to the antenna 3 as an output signal.

Figure 2A:
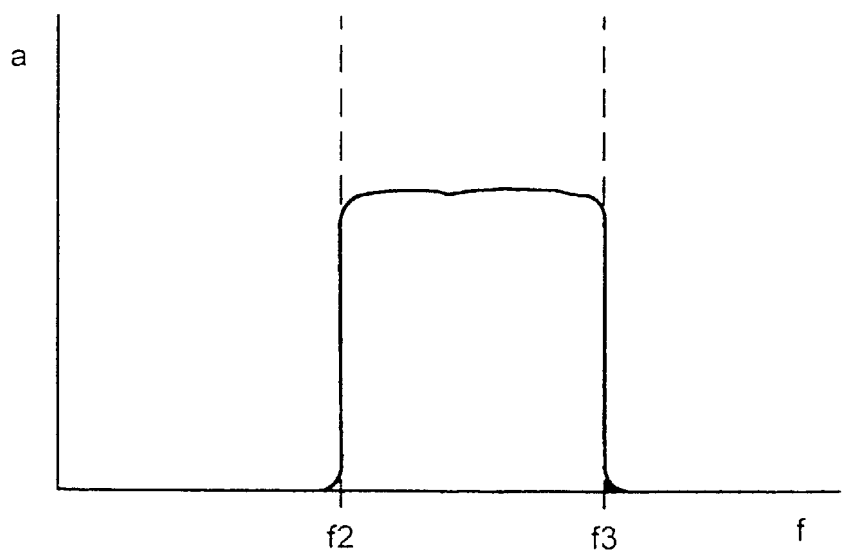
FIGS. 2A and 2B illustrate ideal and real signals of a linearised power amplifier.

FIG. 2A illustrates an "ideal" output signal which it would be desirable for the LPA unit 7 to generate for an input signal having the same frequency spectrum. As can be seen, the amplifier would ideally have linear gain at frequencies only within the desired transmission band, which extends from $f_2$ to $f_3$, and zero gain at frequencies outside the transmission band.

Figure 2B:
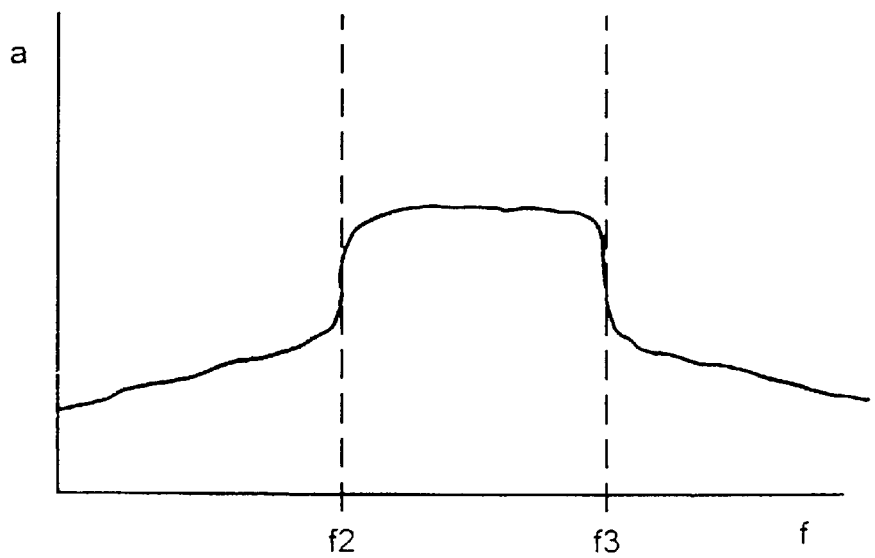

In practice, however, linear amplifiers are subject to certain non-linearities which distort the ideal output signal such that the spectrum of the signal is broadened. FIG. 2B shows the broadened output signal which may be produced by a linear amplifier subject to non-linearities. As can be seen, frequency components are produced outside of the desired transmission band. These components outside of the desired transmission band are unwanted and represent wasted energy. It is obviously desirable to reduce this wasted energy by reducing the spectral broadening of the output signal. This may be achieved by linearising the amplifier using a known method called "feed-forward".

In the feed-forward method, the distortion products (unwanted frequency components) generated by the amplifier are extracted from the output signal. A feed-forward system then amplifies and phases these distortion products in such a way that, when they are fed forward into the amplifier's output, they substantially cancel out the original distortion products.

If the original distortion products are to be reduced sufficiently for the output signal to approach the ideal signal shown in FIG. 2A, precise adaptive amplitude and phase control of the signal is needed in the process. Consequently, it is required that the input signal is accurately known so that it may be compared with the output signal to establish the nature of the distortion products being generated by the amplifier. To achieve this, known, fixed-frequency signals are fed into the amplifier and monitored. Such signals are termed pilot signals. If the pilot signal at the output of the amplifier is compared with the pilot signal at the input of the amplifier, any discrepancies between the two signals may be attributed to the distortion products within the amplifier arising due to its non-linearities. The feed-forward system can then adjust the setting of the amplifier such that the output pilot signal is as close a copy of the input pilot signal as possible. Once the output pilot signal is identical to the input pilot signal, the amplifier is "linearised".

It is clear that such a linearisation system relies on the pilot signal at the output being clear and easily detectable.

Figure 3A:
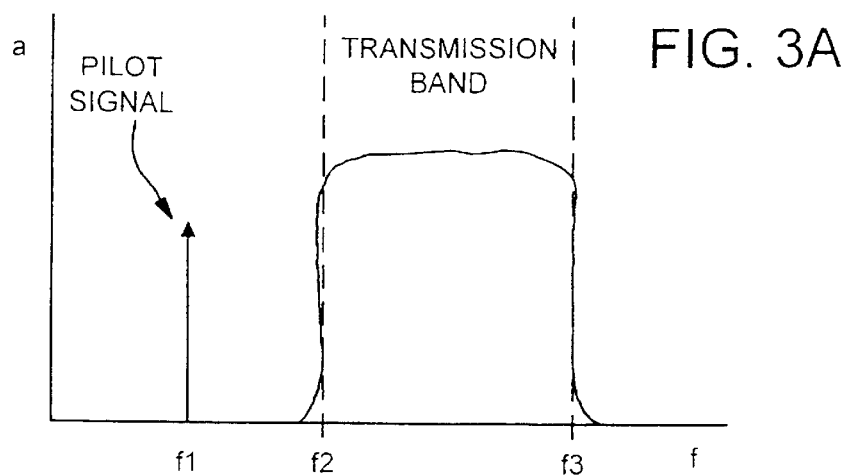
FIGS. 3A, 3B and 3C illustrate stages in the linearisation process.
Figure 3B:
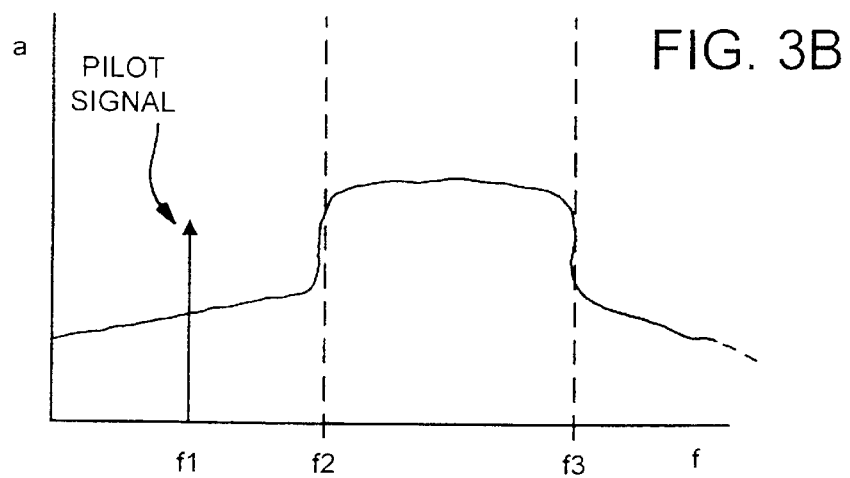

In general, although its exact frequency is somewhat arbitrary, the pilot signal is transmitted on a frequency $f_1$ outside the transmission band which extends from $f_2$ to $f_3$, as shown in FIG. 3A. As described above, ideally the output signal from the linear amplifier would consist of frequencies only within the transmission band $f_3$–$f_2$ as shown in FIG. 3A, thus clearly separating the pilot signal from the information signal. In reality, however, due to non-linearities within the amplifier, the spectrum of the output signal may be broadened and may extend down to frequencies at or close to $f_1$ as shown in FIG. 3B. Although in FIGS. 3A to 3C the pilot signal transmission frequency $f_1$ is shown as being lower than the transmission band, it could just as conveniently be located at a higher frequency than the transmission band.

Figure 3C:
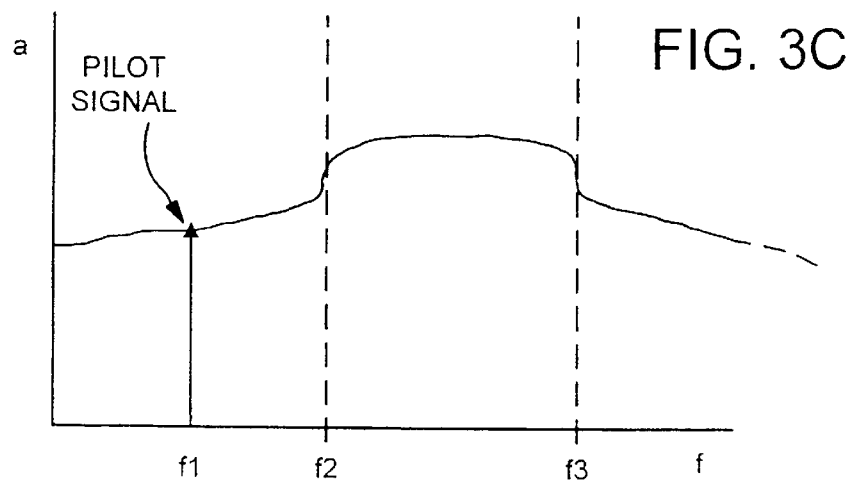

The distortion products of the broadened output signal at frequencies around $f_1$ act as interference signals to the pilot signal. If the interference signals are high, the ratio between the amplitude of the pilot signal and the amplitude of the interference signal may be too low to enable easy detection of the pilot signal as shown in FIG. 3C. If this occurs, problems may be encountered in linearising the amplifier.

Figure 4:
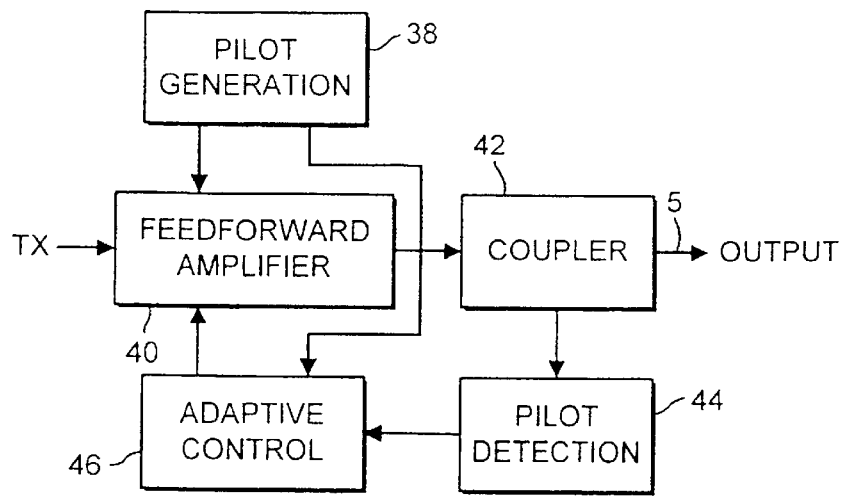
FIG. 4 illustrates components of a linear power amplifier.

FIG. 4 shows the components of a linear power amplifier unit 7 for linearising a power amplifier for use in a transmission system such as that described above. The LPA unit 7 consists of a linear power amplifier 40, a pilot tone generator 38, a coupler 42, a pilot signal detection circuit 44 and an adaptive control unit 46.

During normal operation, the transmission signal TX is fed into the linear power amplifier 40 as described above. The pilot tone generator 38 generates a known, fixed-frequency signal to be used as the pilot signal which is also fed into the amplifier. The transmission signal and the pilot signal are thus summed and are output from the amplifier.

The output of the amplifier is supplied to the coupler 42 which extracts a "sample" of the output for further processing. This extracted "sample" is then passed by the coupler 42 to a pilot signal detection circuit 44 which filters out frequencies either side of the pilot signal. The extracted pilot signal, modified by the distortion products generated by the amplifier, is then sent to the adaptive control unit 46 which compares the modified pilot signal from the output signal with a pure pilot signal from the pilot signal detection circuit to determine the precise nature of the distortion products. The adaptive control unit then adjusts the feed-forward system of the amplifier so that the original distortion products generated within the amplifier are substantially cancelled.

Figure 5:
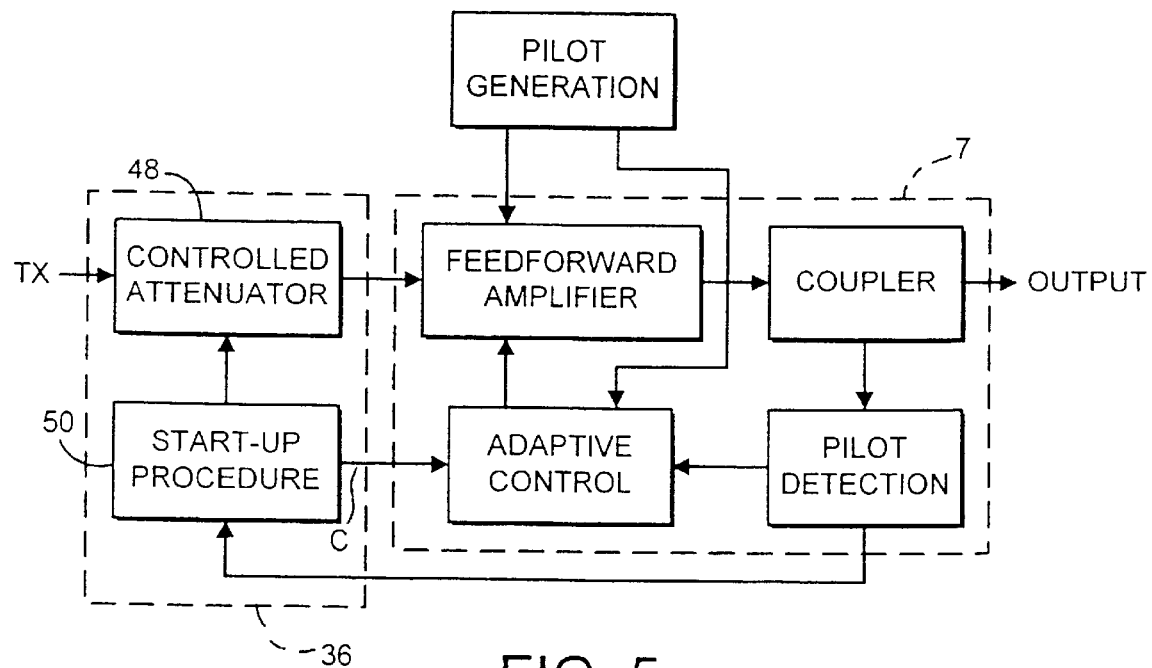
FIG. 5 illustrates components of a linear power amplifier in conjunction with a start-up unit.

FIG. 5 illustrates an improved linearisation system in which the pilot signal is made more easy to detect while the amplifier is being set-up to overcome the problem of interferences discussed above. In this system the components of the LPA 7 are as illustrated in FIG. 4. In addition a start-up unit 36 is provided which includes an attenuator 48 and a start-up procedure unit 50. The transmission signal TX is firstly passed through the attenuator 48 which is controlled so as to vary the power level of the transmission signal TX input to the amplifier. The transmission signal TX is then passed to the linear amplifier 40. Generation and use of the pilot tone are as described above with respect to FIG. 4 to linearise the amplifier.

However, FIG. 5 additionally provides the start-up procedure unit 50. The start-up procedure circuit 50 is connected to control the attenuator 48 and the adaptive control unit 46. The adaptive control unit is connected to receive a control signal C from the start-up procedure unit in addition to the modified pilot signal and the pure pilot signal.

Figure 6:
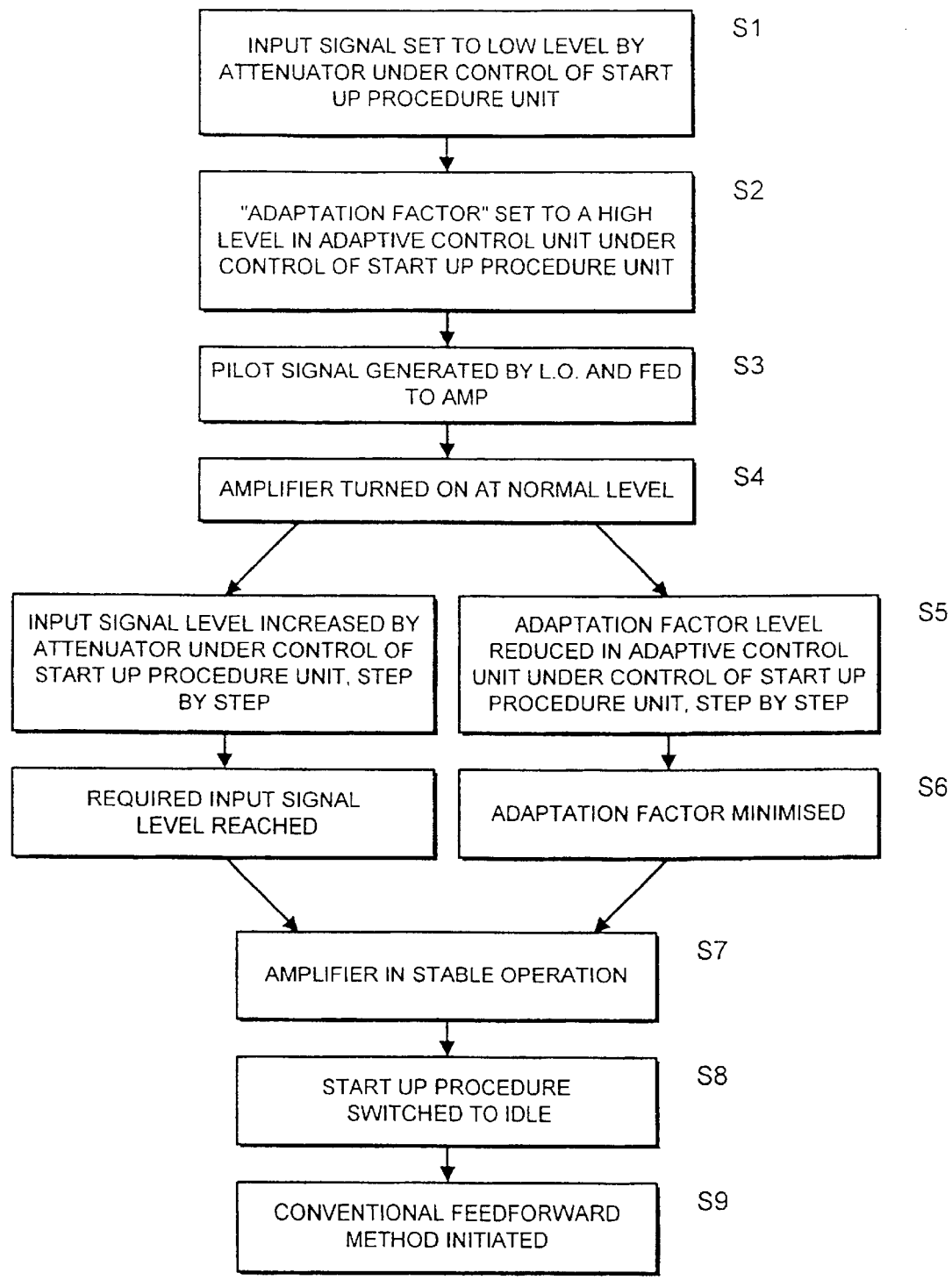
FIG. 6 is a flow chart illustrating steps in a set-up method.

FIG. 6 illustrates a flow diagram of the method used in the present invention, as implemented by the start-up procedure unit 50.

Figure 7A:
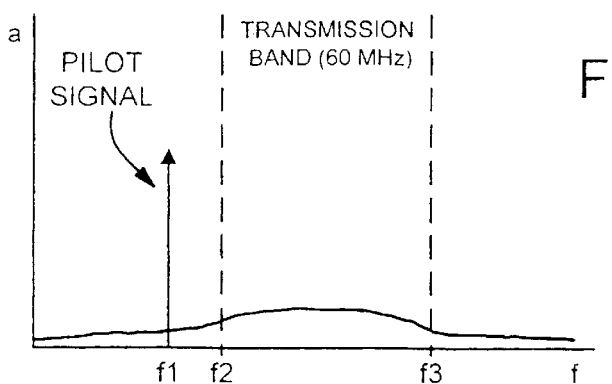
FIGS. 7A through 7D illustrate the output signal of the power amplifier at stages during set-up.
Figure 7B:
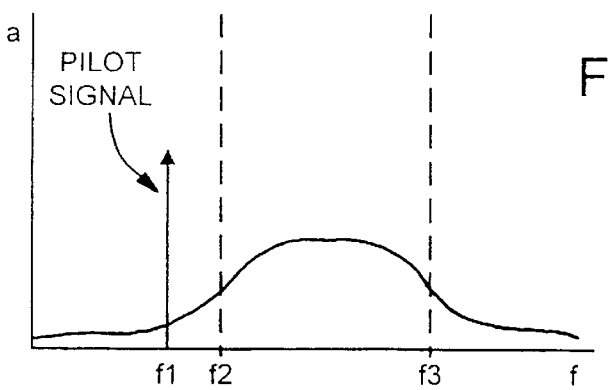
Figure 7C:
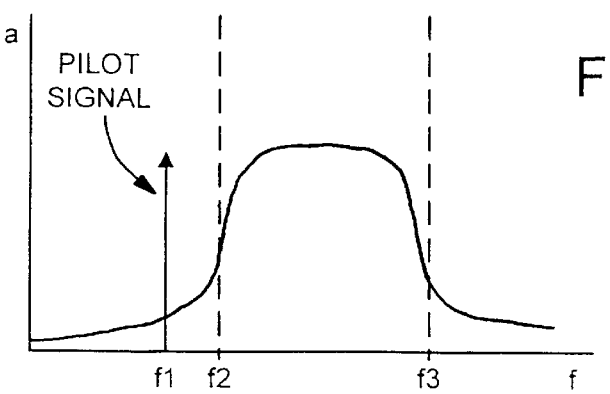
Figure 7D:
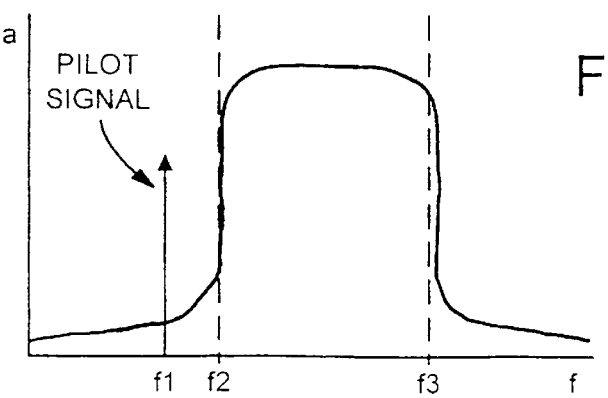

During the initial start-up of the amplifier, the start-up procedure unit 50 sets the attenuator such that the input signal TX is maintained at a very low level (compared with the final required "operational" input level) (step S1). At the same time, the unit 50 sets an "adaptation factor", which determines the speed of the adaptation process, to a high value in the adaptive control unit (step S2). At steps S3 and S4 the pilot signal is generated and the amplifier is turned on to its normal (operational) amplification level. When the amplifier 40 is switched on, since the level of the input signal is low, the level of the amplified output signal is also low (compared with the final required output level). As a consequence, the level of the distortion products is low and thus the pilot signal may be easily and consistently detected since its power level is clearly higher than that of the distortion products as shown in FIG. 7A.

A "sample" of the output signal is extracted by the coupler 42 and passed to the pilot signal detection circuit 44 which in turn feeds the pilot signal (modified by the distortion products generated by the amplifier) to the adaptive control unit 46 and the start-up procedure unit 50. Since the adaptation factor in the adaptive control unit has been set to a high value, the adaptive control unit can quickly adjust the appropriate amplitude and phase control settings in the amplifier's feed-forward system to linearise the amplifier and optimise its frequency response characteristics.

Steps S5 and S6 are then effected in parallel. That is the start-up procedure unit reduces the attenuation factor of the attenuator 48 step by step in order to increase the power level of the input signal TX to the required level. At the same time, the start-up procedure unit reduces the level of the adaptation factor in the adaptive control unit step by step to reduce its sensitivity to the distortion products.

The level of the information signal and the level of the adaptation factor are gradually increased and decreased respectively so that the amplifier may settle into stable operation (step S7) at which time the sampled output pilot signal should be substantially identical to the input pilot signal. The resulting output signal is shown at increasing times in FIGS. 7A to 7D. It can be seen that at all times, the pilot signal is clearly detectable above the level of the distortion products which, as described above, is advantageous for the linearisation circuit and the operation of the amplifier in general.

Once the amplifier has settled into stable operation, the start-up procedure is switched to an ideal state (step S8). The system then uses the known feed-forward linearisation method as described above with reference to FIG. 4.

What is claimed is:

1. A method of setting up a linearising circuit in which a pilot tone is used both during set-up and during normal operation for interference cancellation, wherein the set-up method comprises:

supplying the pilot tone to the linearising circuit at a pilot tone power level;

supplying an input signal to the linearising circuit at a low, starting power level substantially lower than the pilot tone power level;

detecting the pilot tone in an output signal of the linearising circuit;

comparing the detected pilot tone with the supplied pilot tone to determine the interference products of the linearising circuit, and using said interference products to generate a correction signal for interference cancellation at the linearising circuit;

increasing the power level of the input signal to the linearising circuit during set-up while continuing to detect the pilot tone for interference cancellation until the power level of the input signal attains an operational level for normal use.

2. A set-up method according to claim 1, wherein the application of the correction signal is controlled by an adaptation factor.

3. A set-up method according to claim 2, wherein the adaptation factor is set to a high value at initiation of set-up while the power level of the input signal is at the low, starting power level, the adaptation factor being reduced to a normal operational level during set-up.

4. A feed forward linearising system comprising:

a linearising circuit arranged to receive an input signal and a pilot tone for interference cancellation purposes, the pilot tone having a pilot tone power level;

detection means for detecting the pilot tone in an output signal of the linearising circuit and for comparing it with the supplied pilot tone to determine a correction signal;

adaptation means for applying the correction signal to the linearising circuit for interference cancellation purposes; and attenuation means for setting the power level of the input signal to a low, starting level substantially lower than the pilot tone power level for set-up purposes, and for increasing the power level of the input signal during set-up to an operational level for normal use.

5. A system according to claim 4, which comprises a start-up procedure unit for controlling the attenuation means for altering the power level of the input signal.

6. A system according to claim 4, wherein the adaptation means comprises an adaptive control unit for applying the correction signal at a controllable adaptation factor.

7. A system according to claim 5, wherein the start-up procedure unit controls the adaptive control unit to alter the adaptation factor to a high value during set-up.

8. A system according to any of claim 4, wherein the linearising circuit is a power amplifier.

9. A system according to any of claim 4, which comprises a pilot generation circuit for generating the pilot tone.

* * * * *